(12) United States Patent
Nieland et al.

(10) Patent No.: US 12,248,833 B2
(45) Date of Patent: Mar. 11, 2025

(54) MODULE FOR INTEGRATING INTO A CARD BODY OF A SMART CARD, SMART CARD, AND METHOD OF IMPLANTING A MODULE INTO A CARD BODY OF A SMART CARD

(71) Applicant: LINXENS HOLDING, Mantes la Jolie (FR)

(72) Inventors: Carsten Nieland, Dresden (DE); Christophe Mathieu, Mantes la Jolie (FR)

(73) Assignee: LINXENS HOLDING, Mantes-la-Jolie (FR)

( * ) Notice: Subject to any disclaimer, the term of this patent is extended or adjusted under 35 U.S.C. 154(b) by 0 days.

(21) Appl. No.: 18/288,958

(22) PCT Filed: May 21, 2021

(86) PCT No.: PCT/IB2021/000487
§ 371 (c)(1),
(2) Date: Oct. 30, 2023

(87) PCT Pub. No.: WO2022/243717
PCT Pub. Date: Nov. 24, 2022

(65) Prior Publication Data
US 2024/0220758 A1    Jul. 4, 2024

(51) Int. Cl.
*G06K 19/077*    (2006.01)
(52) U.S. Cl.
CPC .............................. *G06K 19/0772* (2013.01)

(58) Field of Classification Search
None
See application file for complete search history.

(56) References Cited

U.S. PATENT DOCUMENTS

| 2012/0286218 A1* | 11/2012 | Mei ......................... H01B 1/22 |
| | | 252/512 |
| 2014/0354490 A1* | 12/2014 | Michalk ................. H01L 24/92 |
| | | 29/601 |

FOREIGN PATENT DOCUMENTS

| WO | 02/063674 A1 | 8/2002 | |
| WO | WO-2020212661 A1 * | 10/2020 | ............. G06K 19/02 |
| WO | 2022243717 A1 | 11/2022 | |

OTHER PUBLICATIONS

International Search and Written Opinion of the International Searching Authority for related International Application No. PCT/IB2021/000487, dated Oct. 30, 2023, 11 pages.

\* cited by examiner

*Primary Examiner* — Kristy A Haupt
(74) *Attorney, Agent, or Firm* — DITTHAVONG, STEINER & MLOTKOWSKI (57) ABSTRACT

The present invention relates in various aspects to a module for integrating into card body of a smart card, to a smart card, and to a method of implanting a module into a card body of a smart card. In an aspect, a module for integrating into a card body of a smart card comprises a support, a contact portion formed on a first surface of the support, and a solder material formed on the contact portion, wherein a surface of the solder material is at least partially covered by a flux.

19 Claims, 6 Drawing Sheets

MODULE FOR INTEGRATING INTO A CARD BODY OF A SMART CARD, SMART CARD, AND METHOD OF IMPLANTING A MODULE INTO A CARD BODY OF A SMART CARD

I. RELATED APPLICATION

This application claims priority to International Patent Application No. PCT/IB2021/000487, filed May 21, 2021, the contents of which is incorporated by reference herein in its entirety.

II. FIELD OF INVENTION

The present invention generally relates to a module for integrating into card body of a smart card, to a smart card, and to a method of implanting a module into a card body of a smart card.

III. STATE OF THE ART

A typical smart card is a plastic card, the size of a credit card, having a pattern of metal contacts imbedded therein. Present smart cards implement an increasing number of functions which result from integrating modules into a card body such that advanced smart cards include an internal chip, an antenna and possibly one or more sensors and/or display modules into a card body of a smart card, such as a biometric sensor, for example, a fingerprint sensor, and an electronic display to display a card validation code (CVC) and/or other information.

With the advancing integration of smart cards into daily life, it is of great interest in the art to provide smart cards with improved fabrication processes and reduced fabrication costs without affecting the smart card quality. Consequently, it is an aim to constantly develop appropriate techniques and materials which allow the lamination of a plurality of foil layers together with an equipping of a laminated card body with appropriate contact structures and/or modules.

Conventionally, modules are integrated into a card body of a smart card in a process comprising milling a recess into the card body and implanting a module into the card body by accommodating the module in the recess such that contact pads of the module are brought into electrical contact with internal contact structures of the card body and electrically and mechanically fixing the module to the card body by means of an adhesive material and/or a solder material. When using a solder material for the electrical and mechanical connection of modules to the card body, the card body, together with the accommodated module, are exposed to a thermal soldering step in which solder material provided on contact pads of at least one of the internal contact structure of the card body and the module establishes a mechanic and electric connection between the module and the card body. The solder material may be subjected to a reflow process for forming a solder bump prior to the soldering step.

Document U.S. Pat. No. 9,684,863 B2 shows a smart card with an external connector formed of an insulating support and a plurality of external metal contact pads arranged on an external face of the support. Furthermore, the smart card has a card body having a housing in which the external connector is arranged and an electronic unit and/or an antenna electrically connected to a plurality of internal metal contact pads arranged underneath the external connector and respectively aligned with the external pads.

Document DE 1020150078 A1 shows a fabrication of a smart card, wherein a card body of the smart card is provided with a recess for accommodating therein a chip module. Within the recess, contact terminals of an antenna structure are exposed for being brought into contact with internal contacts of the chip module when accommodating the chip module within the recess. Herein, a solder paste is applied on the exposed contact terminals in the recess before accommodating the chip module in the recess. An electrical contact between the chip module and the card body is established after locally heating the solder paste.

Document WO 2020/212661 A1 discloses a method for manufacturing a biometric sensor module for a smart card, wherein a biometric sensor is attached at a rear face for fingerprint detection. On the rear face of the biometric sensor module, at least one connection pad is provided, the connection pad comprising a zone that is wettable by a welding material. The connection pads of the biometric sensor module are brought into electrical contact with solder material on connection terminals of internal connection structures within the card body when accommodating the biometric sensor module in the recess of the card body.

Implanting processes of modules into the card bodies of a smart card currently suffer from a complex implantation and solder process in which the solder flow during the implantation is difficult to control. For example, during the implantation, solder material and flux material is to be externally provided to contact pads prior to a solder process. Usually, solder material is applied and subsequently subjected to a reflow process in which a flux material is applied for the solder process as a reducing agent preventing oxides from forming on the surface of molten solder, as well as facilitating the soldering by increasing the wettability of solder contact surfaces. After the reflow process, the flux material is conventionally removed before performing a soldering of one element to another element.

In view of the above described situation, it is an object of the present disclosure to provide a module for integrating into a card body of a smart card, a smart card, and a method of integrating a module into a card body of a smart card with a facilitated fabrication process and at reduced fabrication costs.

IV. SUMMARY

In the following description, the term "module" is understood as meaning a carrier element, such as a PCB element, comprising at least one of at least one electric component, such as a contact and/or interconnection structure (e.g., a conducting line), and at least one electronic component, such as a chip.

The above objects and drawbacks are solved in various aspects of the present disclosure by a module for integrating into a card body of a smart card, a smart card, and a method of implanting a module into a card body of a smart card. More advantageous embodiments of the various aspects are defined in the dependent claims.

In a first aspect of the present disclosure, a module for integrating into a card body of a smart card is provided. In illustrative embodiments herein, the module comprises a support, a contact portion formed on a first surface of the support, and a solder material formed on the contact portion, wherein a surface of the solder material is at least partially covered by a flux. Accordingly, the module may be provided for a solder process when implanting the module into a card body of a smart card during fabrication of the smart card, wherein solder material and flux is pre-applied to the module first before integrating the module into the card body. It is possible to avoid additional solder in the card body or to avoid providing additional solder material in a fabrication process of a smart card. Therefore, a module according to the first aspect of the present disclosure, allows to facilitate a fabrication of a smart card and allows to provide a smart card in a cost efficient manner. For example, the solder material may be a reflowed solder bump provided on the contact portion of the module, the solder bump having flux residuals on its surface containing active flux elements which can be activated during a subsequent implantation process of the module into the card body of the smart card and fabricating the smart card.

In some illustrative embodiments of the first aspect the solder material may be a low-temperature solder material, preferably one of SnBi, SnBiAg and InBi and/or the solder material may be provided as a solder bump. Accordingly, an implantation process for implanting the module into the card body of a smart card during fabrication of the smart card can take place at low temperatures.

In accordance with some illustrative embodiments of the first aspect the flux is a flux from RMA type. This represents an advantageous type of flux material.

In accordance with some illustrative embodiments of the first aspect the flux may be formed of flux residuals provided on a surface portion of the solder material. For example, the flux residuals may represent flux residuals having about 5 to about 50 weight percentage of a flux content of initially provided solder material, i.e., prior to any reflow process which is applied for forming a solder bump, for example. In some special illustrative but non-limiting example, a content of flux in solder material prior to any reflow process may be in a range up to about 20 weight percent, preferably up to about 15 weight percent. In these embodiments, it possible to avoid a flux removal process after possibly reflowing the solder material, e.g. when providing a solder bump. Furthermore, it is possible to use remaining active flux portions comprised in the flux residuals of a first reflow process for improving wettability of solder material during any subsequent reflow process in module integration. In other words, the flux residuals are used "flux" of the original solder material, e.g., original solder paste deposited on contact pad(s) of module, and are usually not capable of improving wettability in its used condition.

In accordance with some illustrative embodiments of the first aspect the module may be one of a contact arrangement, a chip module, a biometric sensor module, and a display module. In some special illustrative examples herein, the contact arrangement may only comprise a plate, such as a plate made of PCB, one of one or more contact pads on a second surface opposite the first surface and one or more interconnections extending between the one or more contact pads and the contact portion on the first surface. Accordingly, the module of the first aspect is suitable for implementing a variety of different functions in a smart card.

In accordance with some illustrative embodiments of the first aspect the module may further comprise a barrier element formed in the contact portion and at least partially surrounding the solder material. The barrier element allows to confine and/or shape the solder material on the contact portion, thereby avoiding migration of solder material away from the contact portion of the module. As a result, the barrier helps to control the position of the solder material on the contact portion.

In an illustrative example of the above embodiment, the barrier element may have a thickness in a range from about 5 μm to about 100 μm, preferably in a range from about 5 μm to 70 μm or 10 μm to 100 μm or 5 μm to 10 μm or 70 μm to 100 μm, more preferably in a range from about 10 μm to about 70 μm. an accordingly formed barrier element is advantageous in that it does not consume too much space on the first surface.

In another illustrative example of the above embodiment, the contact portion may comprise a contact pad and the barrier element may be formed by a wall section of the contact pad at least partially encircling a recess formed in a center portion of the contact pad. Accordingly, the barrier element may be provided integral with the contact pad, thereby avoiding a separate deposition step for the barrier element, e.g., a printing of solder resist for forming a barrier element.

In accordance with some illustrative embodiments of the first aspect the contact portion may comprise a planar contact pad element on which the solder material is formed. Accordingly, the connection pad may provide for an improved coupling between the solder material and the contact portion and, e.g., allow to shape the solder material after a possible reflow process in accordance with a shape of the planar contact pad element.

In an illustrative example of the above embodiment, the planar contact pad element may have, in a top view, a substantially oval shape or a substantially line or stripe shape. Accordingly, a specific design of the connection pad may be implemented by the connection pad element.

In another illustrative example of the above embodiment, the planar contact pad may be in electrical connection with a conductor line formed in the first surface. Accordingly, a connection pad with a coupling to a connecting line in the first surface of the module may be provided, allowing a connection of the planar contact pad with an interconnection routed across the first surface.

In some other illustrative examples of the above embodiment regarding embodiments with a barrier element, the barrier element may be arranged in a distance of the planar contact pad element or the barrier element may partially cover the planar contact pad element. In this way, it is possible to account for an available space for a contact element, e.g., a bump, and a specific size of the contact element. For example, it may be required that a height of a stacking formed of contact pad and barrier does not exceed a certain thickness/height of a holding element used for holding the module, e.g., a hot melt adhesive film fixing the module in position. In case that the height of the stacking would be greater than the certain thickness/height, the barrier is arranged in a distance of the planar contact pad element, while otherwise the barrier element may be arranged on the planar contact pad element so as to partially cover the planar contact pad element.

In accordance with some illustrative embodiments of the first aspect, the module may further comprising an adhesive layer, such as a hot melt layer or another adhesive means, e.g., an adhesive based on cyanoacrylate (for example, lome cyanoacrylate), formed over the support on the first surface, wherein the contact portion is exposed by a cavity formed in the adhesive layer. Accordingly, a mechanical fixation and holding of the module in a cavity of a card body of a smart card when fabricating the smart card may be achieved.

In accordance with some illustrative embodiments of the first aspect, the contact pad may have a barrier pattern formed in an upper surface of the contact pad. Such a barrier pattern may allow to prevent or at least hinder any undesired solder flow during heat treatments.

In a second aspect of the present disclosure, a smart card is provided. In accordance with some illustrative embodiments of the second aspect, the smart card comprises a card body of the smart card having at least one recess formed therein, and at least one module of the first aspect, wherein each module is accommodated into a respective one of the at least one recess. Accordingly, a smart card may be provided without requiring additional material during implanting of at least one module into the smart card in an comparatively easy processing when establishing a solder connect between the card body and the at least one module. The at least one module of the smart card provides a strong solder interconnect with the card body due to the solder and flux pre-applied on the at least one module. The final interconnection in the smart card between the at least one module and the card body has less remaining active flux residuals, thereby causing less corrosion of the smart card.

In some more illustrative embodiments herein, each of the at least one recess may have a body contact portion which is in electrical contact with the contact portion of the module accommodated therein. In some more illustrative embodiments herein, the body contact portion may be provided by a wire pad formed of a plurality of wires exposed in the body contact portion towards the contact portion. In some more illustrative embodiments of the second aspect, the plurality of wires may have a wire pitch of at least 300 μm, preferably of at least 200 μm, more preferably of at least 100 μm, wherein wires of the plurality of wires may have a diameter in a range from about 50 μm to about 300 μm, preferably in a range from about 50 μm to about 200 μm or from about 80 μm to about 300 μm or from about 50 μm to about 80 μm or from about 200 μm to about 300 μm, more preferably from about 80 μm to about 200 μm. Accordingly, it is possible to combine a specific wire diameter with small wire pitch. For example, a wire diameter of about 112 μm may be combined with a wire pitch in the range from about 150 to 290 μm. Basically, with decreasing wire diameter, the wire pitch is decreased and, vice versa, for increasing wire diameter, the wire pitch may be increased accordingly. In this way it becomes possible to deviate a given wire pad having a wire diameter of about 112 μm and about 300 μm. As a result, a good solder connect may be achieved by using only some small amount of flux (e.g., a small amount of flux residuals) so as to have a larger metal area presented to the solder bump. Additionally or alternatively, the plurality of wires may be made of copper, a copper allow or a copper tin alloy. In some illustrative examples herein, at least some of the plurality of wires may be at least partially covered by an insulating coating. A copper-based material provides advantageous effects, such as low resistivity and robustness. It is also mechanically flexible in comparison with other metals. Wires with an isolator coating may be employed for antennas where it may be advantageous to prevent short circuits and bridging between antenna loops of HF antennas, for example. Both types of wires, with and without isolation, may be subjected to ultrasonic wire-embedding, while wires without isolation may be used in thermal-driven embedding.

In a third aspect of the present disclosure, a method of implanting a module into a card body of a smart card is provided. In accordance with some illustrative embodiments of the third aspect, the method comprises providing at least one module of the first aspect, providing the card body of the smart card, forming at least one recess in a surface of the smart card, inserting each of the at least one module into a respective one of the at least one recess, wherein each of the at least one recess has a body contact portion formed in a bottom surface of the recess, the body contact portion being brought into contact with the solder material of the module inserted into the recess, wherein the solder material is at least partially covered by the flux, e.g., flux residuals with active portions of flux, and performing a thermal treatment to at least partially reflow the solder material of the at least module after each of the at least one module is inserted into a respective one of the at least one recess. For example, flux residuals may remain from a reflow process performed when reflowing solder material for forming a solder bump on the module out of the solder material. In some special illustrative examples herein, flux residuals may represent flux residuals having about 5 to about 50 weight percentage of a flux content of initially provided solder material, i.e., prior to any reflow process which is applied for forming a solder bump, for example. In some special illustrative but non-limiting example, a content of flux in solder material prior to any reflow process may be in a range up to about 20 weight percent, preferably up to about 15 weight percent.

In such a method of implanting a module into a card body, solder material is only provided on a contact portion of the at least one module without providing additional solder material in the at least one recess of the smart card. Therefore, no additional solder material or flux is to be provided during the implanting of the module into the card body because solder and flux are pre-applied on the at least one module, wherein the flux may be represented by active flux in flux residuals from a first reflow when, for example, using a solder bump in the at least one module. This allows an easy processing during the implanting in comparison to known techniques in which less remaining active flux residuals result in the final interconnect, thereby causing less corrosion in a smart card under fabrication.

In accordance with some illustrative embodiments of the third aspect, the at least one module may comprise an adhesive layer and the method may further comprise a thermal treatment for activating the adhesive layer. Accordingly, a mechanical interconnection between the at least one module and the card body may be increased.

V. BRIEF DESCRIPTION OF THE DRAWINGS

Various illustrative embodiments and other advantages of the various aspects will become apparent from the detailed description of accompanying figures as presented below.

FIG. 6b schematically shows a cross sectional view along line B-B in FIG. 6a.

FIG. 9b schematically shows a cross-sectional view along line B-B in FIG. 9a.

The figures as accompanying the present disclosure are only provided for schematically showing some concepts of the present disclosure without showing all possible details of certain embodiments and without being actually to scale.

VI. DETAILED DESCRIPTION

Figure 1:
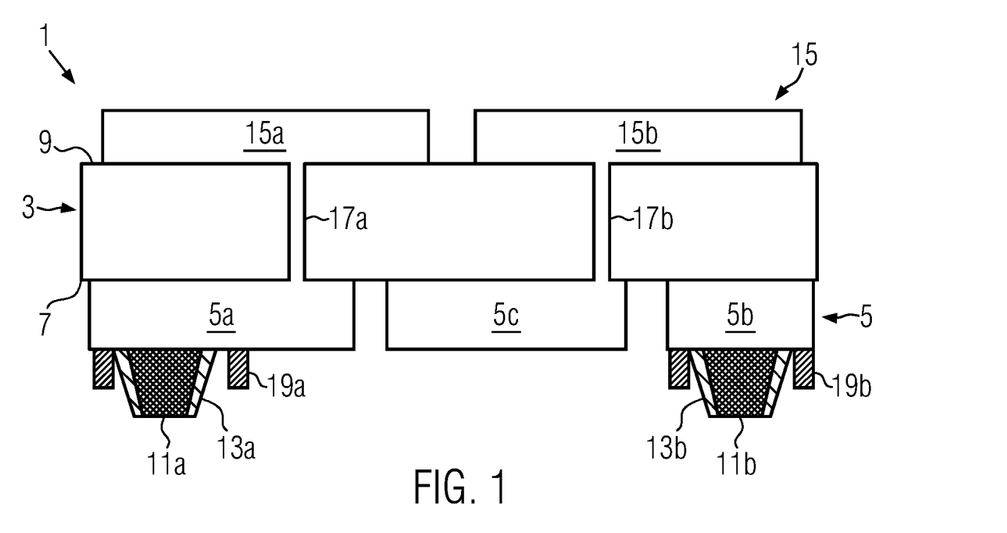
FIG. 1 schematically shows, in a cross sectional view, a module for integrating into a card body of a smart card in accordance with some illustrative embodiments of the present disclosure.

FIG. 1 schematically shows a module 1 for integrating into a card body (not illustrated) of a smart card (not illustrated) in accordance with some illustrative embodiments of the present disclosure. As illustrated in FIG. 1, the module 1 comprises a support 3, a contact portion 5a formed on a first surface 7 of the support 3, and a solder material 11a formed on the contact portion 5a. A surface of the solder material 11a may be at least partially covered by a flux 13a.

In accordance with some illustrative embodiments herein, the support 3 may be a dielectric material layer or dielectric foil. In some illustrative examples, the support 3 may be an injection molding body or it may represent a carrier substrate of a flexible PCB, such as a plate made of PCB, and the like.

With continued reference to FIG. 1, the contact portion 5a formed on the first surface 7 of the support 3 may represent a contact portion of a plurality of contact portions 5a, 5b, 5c representing an inner contact structure of the module 1. Each of the contact portions 5a to 5c may be spaced apart from a neighboring contact portion on the first surface 7 of the support 3. Alternatively, at least some of the contact portions 5a to 5c may be connected by a connecting line (not illustrated). At least some of the contact portions 5a to 5c may have a solder material formed thereon, e.g. solder material 11a on the contact portion 5a and solder material 11b on contact portion 5b. Similar to the solder material 11a on the contact portion 5a the solder material 11b on the contact portion 5b may have a flux 13b formed on the solder material 11b, at least partially covering a surface of the solder material 11b.

For example, and as illustrated in the drawing of FIG. 1, the flux 13a and/or 13b may cover a sidewall surface of the solder material 11a and 11b. However, this does not pose any limitation on the present disclosure and a surface of the solder material 11a, 11b parallel to the first surface 7 may be also at least partially covered by the flux 13a, 13b.

In accordance with some illustrative embodiments of the present disclosure, the flux 13a and 13b may be provided by flux residuals that may remain from flux deposited beforehand on the solder material 11a, 11b when subjecting the solder material 11a, 11b to a reflow process when forming a solder bump for each of the solder materials 11a, 11b where the flux is deposited for providing a good wettability on the contact portions 5a and 5b in order to establish a good solder joint. The flux 13a, 13b may be unreacted flux material that did not reduce an oxide during the reflow process to which the solder materials 11a, 11b are subjected to. Due to the flux 13a, 13b, the module 1 may be equipped with flux material without the need of adding additional flux when implanting the module 1 into a card body (not illustrated) of a smart card (not illustrated) when fabricating the smart card (not illustrated). In this way, additional material deposition steps and inclusion of additional materials during the fabrication processes is avoided and the fabrication process may be simplified, as well as productions costs in the preparation of modules may be reduced.

In accordance with some illustrative embodiments of the present disclosure, the solder material 11a, 11b as schematically shown in FIG. 1 may represent reflowed solder material with flux residuals formed at least partially on the solder bump. With the flux 13a, 13b representing residual flux material in some special illustrative examples, it is possible to reduce the total amount of flux when preparing the module 1, thereby avoiding additional steps of removing flux material, including remaining active flux portions. Such a removal of flux material would expose the module 1 to chemical flux removing agents that could lead to undesired corrosion in the module 1 and, accordingly, such a removal is avoided in the present disclosure.

Referring to FIG. 1, a barrier element 19a may be formed on the contact portion 5a and a barrier element 19b may be formed on the contact portion 5b. Each of the barrier elements 19a, 19b may be formed such that the respective one of the solder materials 11a, 11b is at least partially surrounded by the barrier element 19a, 19b. In providing the barrier element 19a, 19b in some illustrative examples, it is possible to more accurately locate the solder materials 11a, 11b over the contact portions 5a, 5b. Furthermore, the barrier elements 19a, 19b may help in avoiding migration of solder material into undesired regions of the module 1 and/or a card body (not illustrated) of a smart card (not illustrated) when fabricating a smart card by implanting the module 1 into the card body (not illustrated) of the smart card (not illustrated) under fabrication. However, the person skilled in the art will appreciate that the barrier elements 19a, 19b are optional and may be avoided in some illustrative embodiments of the present disclosure. In some illustrative examples herein, the barrier elements 19a, 19b may be formed by depositing a pattern of solder resist on the contact portions 5a and 5b.

With ongoing reference to FIG. 1, a second surface 9 of the support 3 is shown, the second surface 9 representing a surface opposite the first surface 7 of the support 3. The second surface 9 may have additional contact portions 15a, 15b provided thereon, the contact portions 15a and 15b representing an external contact structure of the module 1 by means of which the module 1 being implanted into a card body (not illustrated) of a smart card (not illustrated) may allow access to the inner contact structure 5 of the module 1. At least one of the contact portions 15a and 15b may be electrically connected with at least one of the contact portions 5a to 5c by a via, such as a via 17a possibly connecting the contact portion 15a with the contact portion 5a and a via 17b possibly connecting the contact portion 15b with the contact portion 5c. However, this does not pose any limitation on the present disclosure and, instead of a single via extending along a thickness direction of the support 3 through the support 3 between the surfaces 7 and 9, one or more vertical conducting lines may be embedded into the support 3 for laterally routing an electrical connection between contact portions on the first surface 7 and contact portions on the second surface 9.

In accordance with some illustrative embodiments of the present disclosure, the module 1 may be one of a contact arrangement, a sensor module, and a display module. For example, at least one of the contact portions of the external contact structure 15 may serve as a sensor electrode of a sensor (not illustrated) integrated into the module 1. Additional or alternatively, at least one of the contact portions of the external contact structure 15 may be operatively connected with a displaying unit (not illustrated) of the module 1 such that the display unit (not illustrated) may be in electrical communication with the internal contact structure 5 of the module 1.

Figure 2:
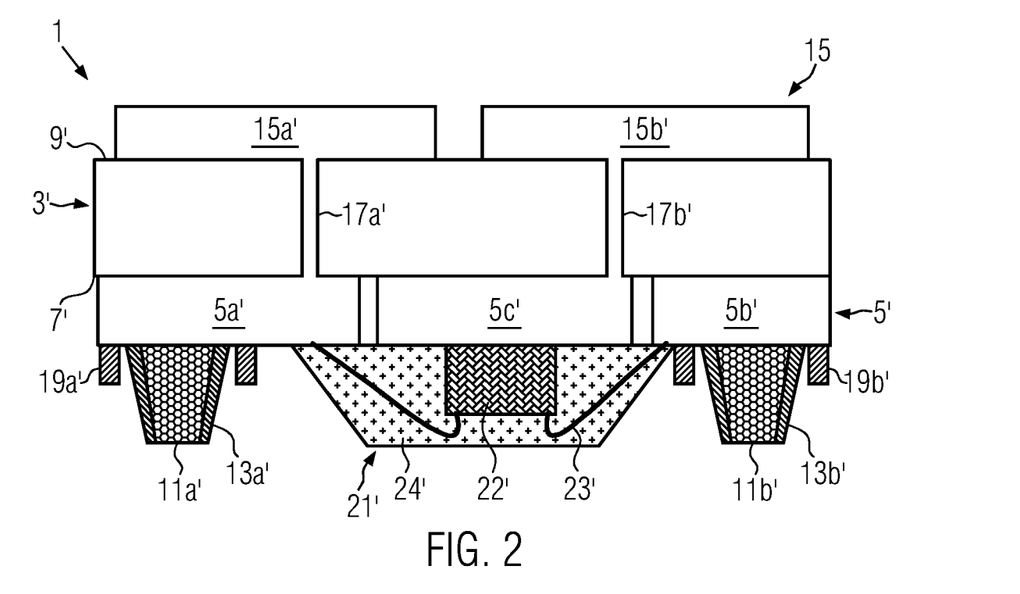
FIG. 2 schematically shows, in a cross sectional view, a module for integration into a card body of a smart card in accordance with other illustrative embodiments of the present disclosure.

FIG. 2 schematically shows a module 1' for integrating into a card body (not illustrated) of a smart card (not illustrated) in accordance with some illustrative embodiments of the present disclosure. As illustrated in FIG. 2, the module 1' comprises a support 3', a contact portion 5a' formed on a first surface 7' of the support 3', and a solder material 11a' formed on the contact portion 5a'. A surface of the solder material 11a' may be at least partially covered by a flux 13a'.

In accordance with some illustrative embodiments herein, the support 3' may be a dielectric material layer or dielectric foil. In some illustrative examples, the support 3' may be an injection molding body or it may represent a carrier substrate of a flexible PCB, such as a plate made of PCB, and the like.

With continued reference to FIG. 2, the contact portion 5a' formed on the first surface 7' of the support 3' may represent a contact portion of a plurality of contact portions 5a', 5b', 5c' representing an inner contact structure of the module 1'. Each of the contact portions 5a' to 5c' may be spaced apart from a neighboring contact portion on the first surface 7' of the support 3'. Alternatively, at least some of the contact portions 5a' to 5c' may be connected by a connecting line (not illustrated). At least some of the contact portions 5a' to 5c' may have a solder material formed thereon, e.g. solder material 11a' on the contact portion 5a' and solder material 11b' on contact portion 5b'. Similar to the solder material 11a' on the contact portion 5a' the solder material 11b' on the contact portion 5b' may have a flux 13b' formed on the solder material 11b', at least partially covering a surface of the solder material 11b'.

For example, and as illustrated in the drawing of FIG. 2, the flux 13a' and/or 13b' may cover a sidewall surface of the solder material 11a' and 11b'. However, this does not pose any limitation on the present disclosure and a surface of the solder material 11a', 11b' parallel to the first surface 7' may be also at least partially covered by the flux 13a', 13b'.

In accordance with some illustrative embodiments of the present disclosure, the flux 13a' and 13b' may be provided by flux residuals that may remain from flux deposited beforehand on the solder material 11a', 11b' when subjecting the solder material 11a', 11b' to a reflow process when forming a solder bump for each of the solder materials 11a', 11b'. This means, the flux 13a', 13b' may be unreacted flux material that did not reduce an oxide during the reflow process to which the solder materials 11a', 11b' are subjected to. Due to the flux 13a', 13b', the module 1' may be equipped with flux material without the need of adding additional flux when implanting the module 1' into a card body (not illustrated) of a smart card (not illustrated) when fabricating the smart card (not illustrated). In this way, additional material deposition steps and inclusion of additional materials during the fabrication processes is avoided and the fabrication process may be simplified, as well as productions costs in the preparation of modules may be reduced.

In accordance with some illustrative embodiments of the present disclosure, the solder material 11a', 11b' as schematically shown in FIG. 2 may represent reflowed solder material with flux residuals formed at least partially on the solder bump. With the flux 13a', 13b' representing residual flux material in some special illustrative examples, it is possible to reduce the total amount of flux when preparing the module 1', thereby avoiding additional steps of removing flux material, including remaining active flux portions. Such a removal of flux material would expose the module 1' to chemical flux removing agents that could lead to undesired corrosion in the module 1' and, accordingly, such a removal is avoided in the present disclosure.

Referring to FIG. 2, a barrier element 19a' may be formed on the contact portion 5a' and a barrier element 19b' may be formed on the contact portion 5b'. Each of the barrier elements 19a', 19b' may be formed such that the respective one of the solder materials 11a', 11b' is at least partially surrounded by the barrier element 19a', 19b'. In providing the barrier element 19a', 19b' in some illustrative examples, it is possible to more accurately locate the solder materials 11a', 11b' over the contact portions 5a', 5b'. Furthermore, the barrier elements 19a', 19b' may help in avoiding migration of solder material into undesired regions of the module 1' and/or a card body (not illustrated) of a smart card (not illustrated) when fabricating a smart card by implanting the module 1' into the card body (not illustrated) of the smart card (not illustrated) under fabrication. However, the person skilled in the art will appreciate that the barrier elements 19a', 19b' are optional and may be avoided in some illustrative embodiments of the present disclosure. In some illustrative examples herein, the barrier elements 19a', 19b' may be formed by depositing a pattern of solder resist on the contact portions 5a' and 5b'.

With ongoing reference to FIG. 2, a second surface 9' of the support 3' is shown, the second surface 9' representing a surface opposite the first surface 7' of the support 3. The second surface 9' may have additional contact portions 15a', 15b' provided thereon, the contact portions 15a' and 15b' representing an external contact structure of the module 1' by means of which the module 1' being implanted into a card body (not illustrated) of a smart card (not illustrated) may allow access to the inner contact structure 5' of the module 1'. At least one of the contact portions 15a' and 15b' may be electrically connected with at least one of the contact portions 5a' to 5c' by a via, such as a via 17a' possibly connecting the contact portion 15a' with the contact portion 5a' and a via 17b' possibly connecting the contact portion 15b' with the contact portion 5c'. However, this does not pose any limitation on the present disclosure and, instead of a single via extending along a thickness direction of the support 3' through the support 3' between the surfaces 7' and 9', one or more vertical conducting lines may be embedded into the support 3' for laterally routing an electrical connection between contact portions on the first surface 7' and contact portions on the second surface 9'.

In accordance with some illustrative embodiments of the present disclosure, the module 1' may be one of a sensor module, a display module, and an arbitrary chip module. For example, at least one of the contact portions of the external contact structure 15' may serve as a sensor electrode of a sensor (not illustrated) integrated into the module 1'. Additional or alternatively, at least one of the contact portions of the external contact structure 15 may be operatively connected with a displaying unit (not illustrated) of the module 1 such that the display unit (not illustrated) may be in electrical communication with the internal contact structure 5' of the module 1.

Still referring to FIG. 2, the module 1' further has a chip package 21' mounted to the module 1' over the first surface 7' of the support 3'. By way of example, and as illustrated in FIG. 2, the chip package 21 may be formed on the contact portion 5c' such that a chip 22' is attached to the contact portion 5c' and coupled via wire bonding 23' and 24' to respective ones of the contact portions 5a' and 5b'. The chip 22' may be further encapsulated by an encapsulant 24' covering and protecting the chip 22' and the wire bonding 23', 24'. Accordingly, the chip package 21' may be in electrical communication with the internal contact structure 5'. Additionally, the chip package 21' may be in electrical communication with the external contact structure 15' such that the chip package 21' may be electrically accessed via at least one of the internal contact structure 5' and the external contact structure 15'.

Figure 3:
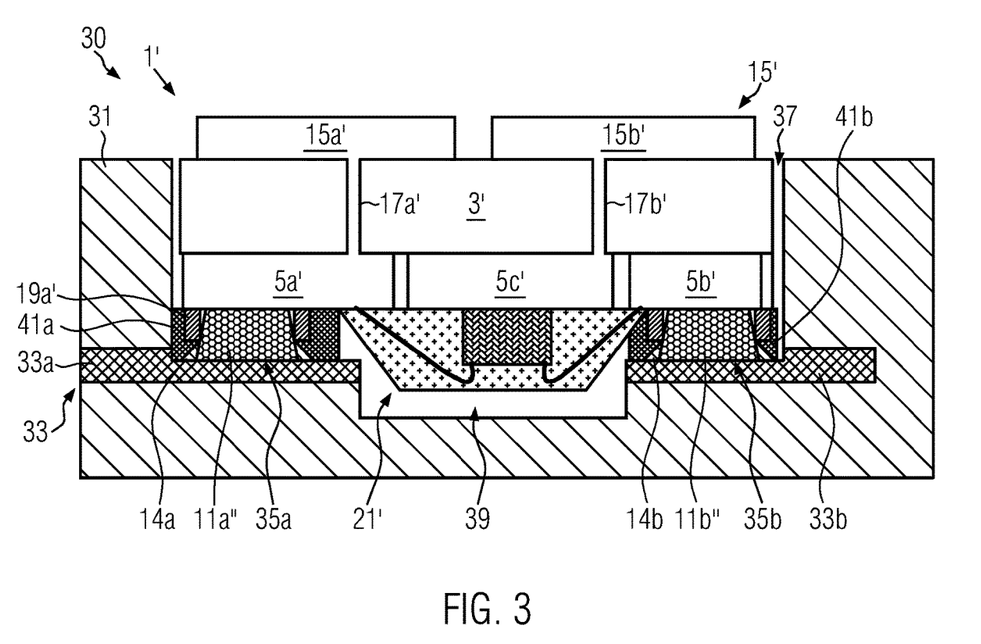
FIG. 3 schematically shows, in a cross sectional view, a smart card in accordance some illustrative embodiments of the present disclosure.

With regard to FIG. 3, a smart card 30 is schematically illustrated in a cross sectional view, where for an ease of illustration, only an enlarged portion of the smart card 30 is schematically illustrated. FIG. 3 shows the enlarged portion of the smart card 30 at a module 1' corresponding to the module 1' described above. The module 1' is accommodated into a card body 31 of the smart card 30. That is, the smart card 30 comprises the card body 31 of the smart card 30 having at least one recess 37 formed therein and the module 1' being accommodated into the recess 37. The module 1' is in correspondence with the module 1' of FIG. 2 above and a description of the module 1' is therefore omitted for ease of description. This does not pose any limitation on the present disclosure and the person skilled in the art will appreciate that instead of the module 1', the module 1 of FIG. 1 above may be accommodated into the recess 37. Furthermore, the person skilled in the art will appreciate that the card body 31 may have at least one additional recess (not illustrated) formed therein for accommodating at least one additional module (not illustrated).

In accordance with the illustrative embodiment depicted in the drawing of FIG. 3, the card body 31 has an internal contact structure 33 embedded therein, the internal contact structure 33 comprising internal connection lines 33a and 33b with each having a respective body contact portion 35a and 35b. The body contact portion 35a is in electrical contact with the contact portion 5a' of the module 1' through a solder connection 11a". Similarly, the contact body portion 35b is in electrical connection with the contact portion 5b' of the module 1' via a solder connection 11b". Accordingly, the chip package 21' may be in electrical communication with the internal connection structure 33 of the card body 31. Therefore, the chip package 31' is electrically accessible via the external contact structure 15' of the module 1' and the internal connection structure 33 of the card body 31. In some special illustrative examples, the internal connection structure 33 may represent an internal connection to an antenna (not illustrated) which is embedded into the card body 31.

With ongoing reference to the illustration in FIG. 3, the module 1' may be additionally attached to the card body 11 by means of an adhesive 41a and 41b provided at the contact portions 35a and 35b.

In accordance with the illustrative example shown in FIG. 3, some residual flux 14a and 14b may be present, at least partially covering a surface of the solder connection 11a" and 11b", respectively. The flux 14a and 14b, respectively, may allow to reduce oxidation that possibly occurs during the fabrication of the smart card at the body contact portions 35a and 35b, respectively. Furthermore, the flux 14a, 14b helps to gain good wettability on the body contact portions 35a and 35b in order to establish a good solder joint. The person skilled in the art, will appreciate that upon leaving residual flux 14a and 14b at the body contact portions 35a and 35b, corrosion of the body contact portion 35a, 35b is avoided because no chemical flux removing agent is employed during the fabrication of the smart card 30.

With ongoing reference to FIG. 3, the recess 37 may be formed in the shape of a stepped recess having a deeper opening 39 at the bottom of the recess 37 to accommodate the chip package 21' of the module 1'. However, this does not pose any limitation on the present disclosure and the person skilled in the art will appreciate that the opening 39 is optional and no opening 39 may be present in case of the module 1 of FIG. 1.

Figure 4:
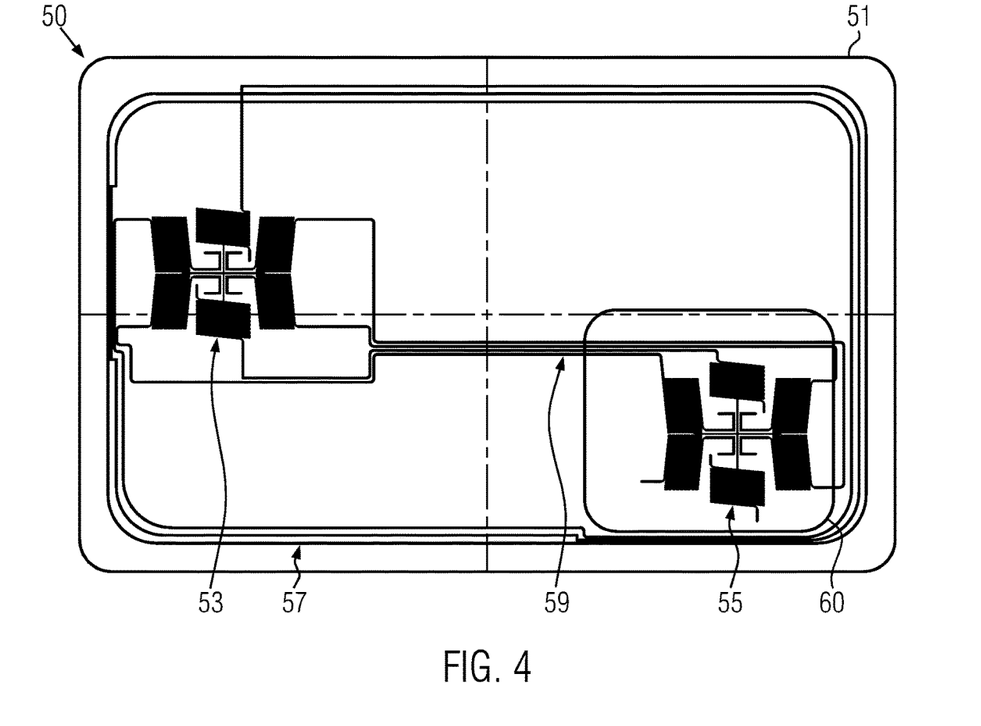
FIG. 4 schematically shows, in a top view on a smart card, a card body of the smart card in accordance some illustrative embodiments of the present disclosure during fabrication of the smart card.

Referring to FIG. 4, a top view of a layout 50 of a smart card 51 is shown, as obtained in accordance with an x-ray imaging of the smart card 51. The smart card 51 is illustrated at the stage during fabrication at which no module is implanted into the smart card 51 yet. According to the layout 50 as showing in FIG. 4, the smart card 51 at the depicted stage has a body contact portion 53 and a body contact portion 55 embedded into a card body of the smart card 51. The body contact portions 53 and 55 are connected with an antenna module 57 and an internal interconnection line 59. It is therefore possible to contact the antenna module 57 via the body contact portion 53, as well as contacting the antenna module 57 via the body contact portion 55 through the interconnection line 59. A portion of the smart card layout 50 around the body contact portion 55 as indicated by reference numeral 60 is shown in an enlarged view in FIG. 5.

Figure 5:
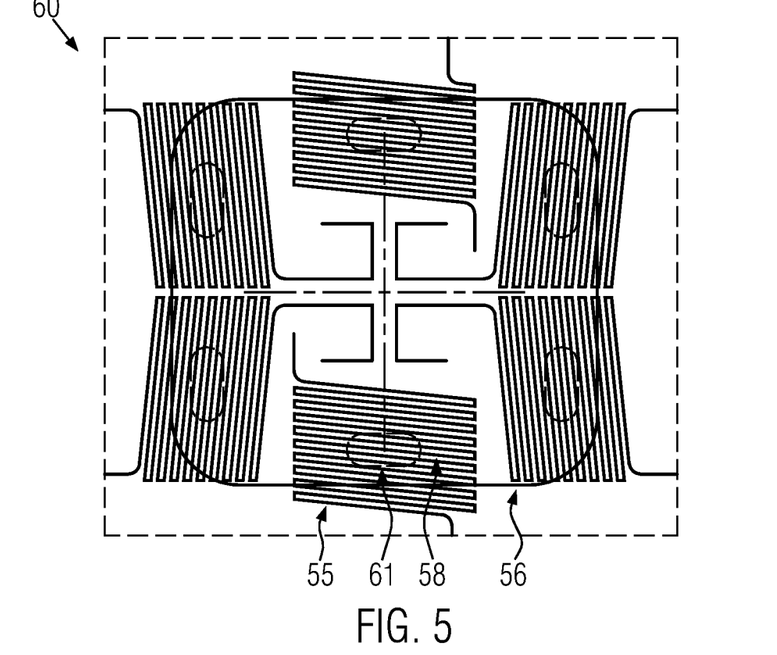
FIG. 5 schematically shows, in an enlarged view, a portion of the smart card shown in FIG. 4.

FIG. 5 showing an enlarged view of the region 60 in FIG. 4, schematically illustrates in greater detail the body contact portion 55 of FIG. 4. In particular, the body contact portion 55 comprises a plurality of wire pads which are schematically indicated by arrows 55 and 56 in the illustration of FIG. 5. The wire pads are formed by a meander like arrangement of an electric wire 58 which partially covers a plane region in the illustration of FIG. 5. Furthermore, as indicated in FIG. 5, an arrangement of contact pads is indicated via regions 61, showing a location of contact pads of a module (not illustrated) which is to be brought into contact with the body contact portion 55. That is, each of the plurality of contact pads 61 is brought into electrical contact with a respective one of a plurality of wire pads 56 of the body contact portion 55. Due to the meander like arrangement of wires in each of the wire pads 56 it can be assured that a sufficient electrical contact between the contact pad 61 and a respective wire pad 56 is established.

As illustrated in the drawing of FIG. 5, each wire pad may be formed by an arrangement of electrical wires that extend in a meander like fashion in the region of a respective wire pad 56. For example, each wire pad may consist of a plurality of wires extending substantially in parallel along a length direction of the arrangement and in parallel along a width direction of the arrangement. Herein, the length direction represents a direction along a longest dimension of the arrangement, while a width direction is oriented substantially perpendicular thereto. Furthermore, either one of the length direction and the width direction of the arrangement is slanted with regard to a sidewall of a cavity (not illustrated) which is to be milled into the card body at the location of the body contact portion 55 for accommodating a module (not illustrated). For example, tilting of meander like extending wires may be under an orientation of 0° to about 80° with regard to a cavity edge (not illustrated). Additionally or alternatively, a tilting of wires of a wire pad may be oriented under an angle of about 0° to about 45° with regard to a wire of the internal interconnection line 59 in FIG. 4.

In accordance with some illustrative embodiments of the present disclosure, wires of a wire pad 56 may be made of copper or a copper alloy. In some specific illustrative examples, a wire may be given by an isolated wire or by a non-isolated wire. A diameter of a wire may be in a range from 50 μm to about 300 μm, preferably in a range from 50 μm to about 200 μm or from about 80 μm to about 300 μm, more preferably in a range from about 80 μm to about 200 μm. Accordingly, it is possible to combine a specific wire diameter with small wire pitch. For example, a wire diameter of about 112 μm may be combined with a wire pitch in the range from about 150 to 290 μm. Basically, with decreasing wire diameter, the wire pitch is decreased and, vice versa, for increasing wire diameter, the wire pitch may be increased accordingly. In this way it becomes possible to deviate a given wire pad having a wire diameter of about 112 μm and about 300 μm. As a result, a good solder connect may be achieved by using only some small amount of flux (e.g., a small amount of flux residuals) so as to have a larger metal area presented to the solder bump and it is ensured that already a small amount of flux, e.g., flux residuals, is sufficient for wetting wires of a wire pad at the region near a contact pad.

Figure 6A:
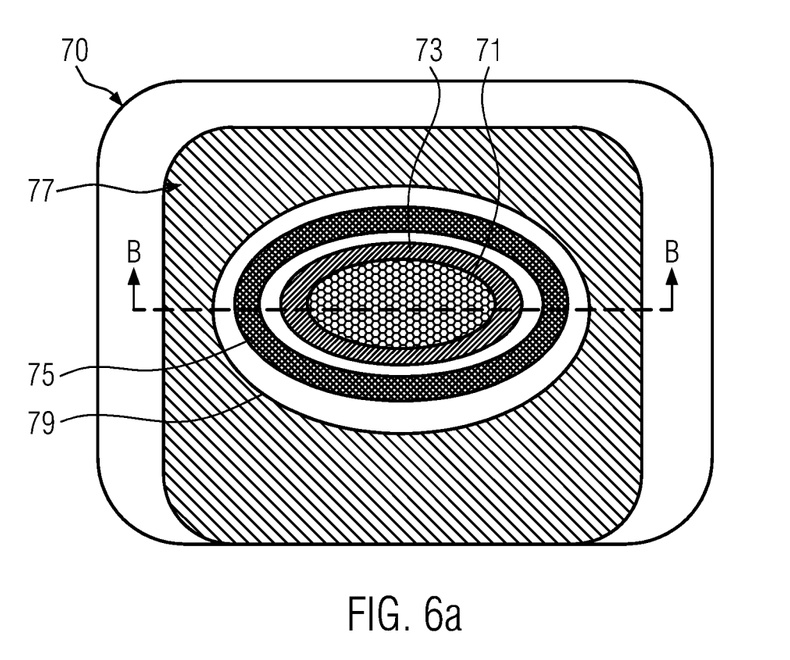
FIG. 6a schematically shows, in a top view, a contact portion of a module in accordance some illustrative embodiments of the present disclosure.
Figure 6B:
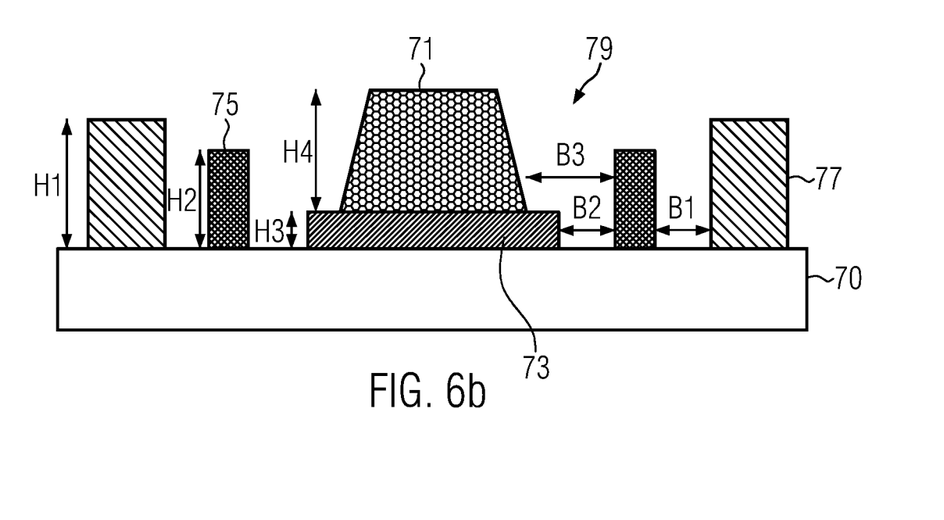

Referring to FIGS. 6a and 6b, a contact portion 70 in accordance with some illustrative embodiments of the present disclosure will be described. FIG. 6a shows schematically a top view onto the contact portion 70, while FIG. 6b schematically shows a cross sectional view of the contact portion 70 along a line B-B in FIG. 6a. The contact portion 70 has a solder material 71, e.g. a solder bump, formed over the contact portion 70. In accordance with some illustrative examples, a contact pad 73 may be provided directly on the contact portion 70 and the solder material 71 may be formed on the contact pad 73. The contact pad 73 may have any desired shape, e.g. an oval shape, a strip like shape, a rectangular shape, a round shape or any polygonal shape when seen in a top view.

With ongoing reference to FIGS. 6a and 6b and in accordance with some illustrative embodiments of the present disclosure, a barrier element 75 may be formed on the contact portion 70, the barrier element 75 surrounding the solder material 71. For example, the barrier element 75 may be a ring shaped element or oval shape or general circular shape when seen in a top view, surrounding the solder material 71 and the contact pad 73. In some illustrative examples herein, the barrier element 75 may be formed by depositing a patterned solder resist on the contact portion 70.

In accordance with some special illustrative examples, a spacing B2 of the barrier element to the contact pad 73 may be smaller than a spacing of B3 of the barrier element 75 to the solder material 71. The spacing B2 may be in general equal to or greater than 0 (B2≥0), while the spacing B3 may be in general greater than 0 (B3>0). That is, the barrier element 75 may be placed directly adjacent to the contact pad 73, including the case of the barrier element 75 being positioned on top of the contact pad 73 adjacent to the solder material 71. The barrier element 75 may allow to locate and define a position of the solder material 75 at a certain position over the contact portion 70. Furthermore, the barrier element 75 may serve as a barrier against a migration of material of the solder material 71 outside the contact pad 73.

Referring to FIG. 6b a height H3 of the contact pad 73 is generally less than a height H4 of the solder material 71 (H3<H4). Furthermore, a height H2 of the barrier element 75 is preferably smaller than a combined height of the contact pad 73 and the solder material 71, i.e. H2≤H3+H4. In this way, it is insured that the solder material 71 may come into contact with a body contact portion (not illustrated) of a card body (not illustrated).

In accordance with some illustrative embodiments and as shown in FIGS. 6a and 6b, an adhesive layer 77 may be formed over the contact portion 70 around the barrier element 75. The adhesive layer 77 may be spaced from the barrier element 75 by a spacing B1. The spacing B1 is preferably greater than 0 (B1>0). In some illustrative examples herein, the adhesive layer 77 may be provided by a hot melt, and the like. A height H1 of the adhesive layer 77 is in general greater than the height H2 of the barrier element 75 and smaller than the combined height of the contact pad 73 and the solder material 71, i.e. H2<H1≤H4+H3.

In accordance with some alternative embodiments (not illustrated in FIG. 6), the spacing B2 may be smaller zero (B2<0) which means that the barrier element 75 may be located on the contact pad 73 such that an upper surface of the contact pad 73 is partially covered by the barrier element 75. In this case, the height H1 is greater than a sum of height H2 and height H3 (H1>H2+H3).

Figure 7:
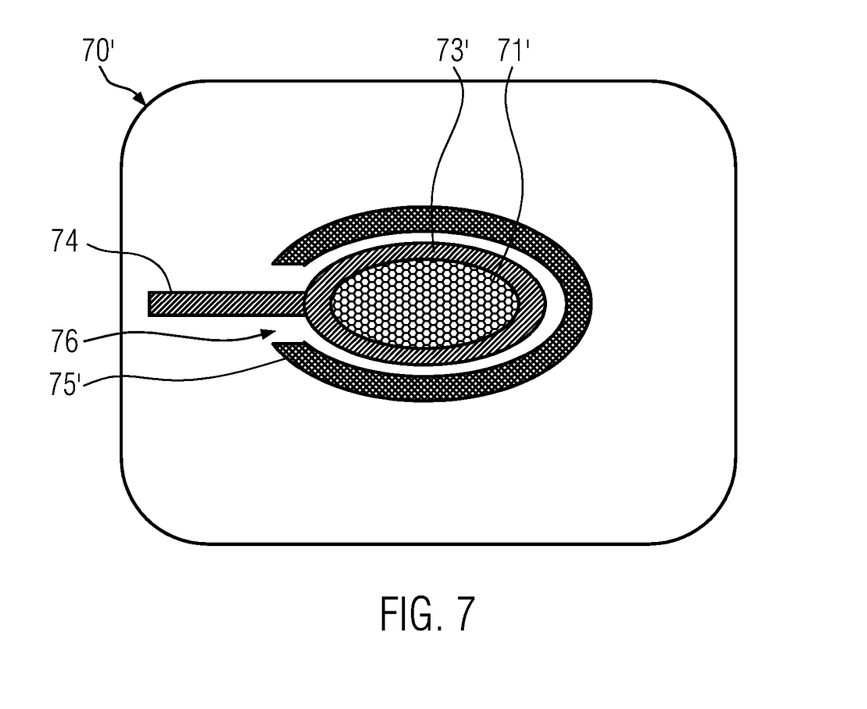
FIG. 7 schematically shows, in a top view a contact portion of a module in accordance some other illustrative embodiments of the present disclosure.

Referring to FIG. 7, a contact portion 70' is schematically shown in a top view, the contact portion 70' having a solder material 71' formed over the contact portion 70', e.g. a solder bump. The solder material 71' may be provided on a contact pad 71' which is formed on the contact portion 70'. The contact pad 73' may be similar to the contact pad 73 as described above with regard to FIGS. 6a and 6b.

In accordance with some illustrative embodiments and as shown in FIG. 7, the contact pad 73' may be partially surrounded by a barrier element 75', leaving access to the contact pad 73' from outside a region surrounded by the barrier element 75'. Accordingly, a conductor line 74 extending on the contact portion 70' to the contact pad 73' may pass through an opening in the barrier element 75' for contacting the contact pad 73'. Accordingly, the contact pads 73' may be electrically connected with an internal connection of the module (not illustrated) outside the contact portion 70'. In some illustrative examples herein, the barrier element 75' may be formed by depositing a patterned solder resist on the contact portion 70'.

In accordance with some illustrative examples in alternative embodiments (not illustrated in FIG. 7), the conductor line 74 may have a mirco etching instead of using the barrier layer portion 75' near the opening in order to created a recess in the conductor line 74, thereby providing another kind of barrier layer as a stop line to prevent solder from running along the conductor line 74.

The barrier element 75' may be in dimension similarly to the barrier element 75 as described above with regard to FIG. 6b. In particular, dimensions of the solder material 71', the contact pad 73', the barrier limit 75' and an adhesive layer (not illustrated in FIG. 7) may correspond to dimensions as discussed above to the corresponding elements shown in FIG. 6b.

The opening 76 in the barrier element 75' may correspond to a recess in the barrier element 75' removing at most 40% of the barrier element 75 in FIG. 6b when set into relation.

Figure 8A:
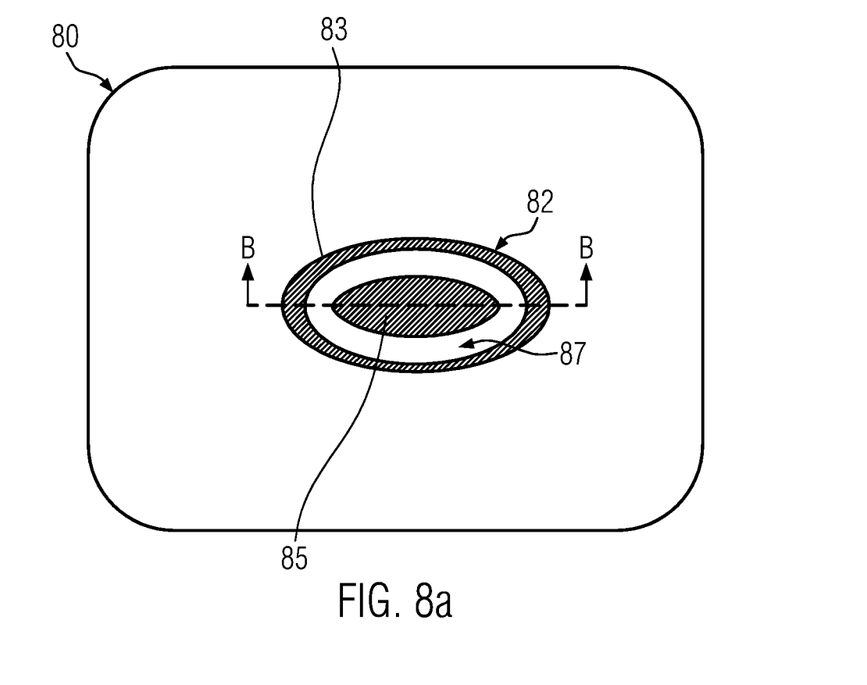
FIG. 8a schematically shows, in a top view a contact portion of a module in accordance with another illustrative embodiment of the present disclosure.

Referring to FIG. 8a, a contact portion 80, in accordance with some illustrative embodiments of the present disclosure, is schematically shown. For ease of illustration, the contact portion 80 is only shown with regard to a contact pad 82 having a barrier element 83 to illustrate a spatial relation and arrangement of the barrier element 83 with regard to the contact pad 82. A solder material 85 is present, e.g. in form of a solder bump, corresponding to the solder material 71 and 71' as described above with regard to FIGS. 6a, 6b and

7. However, the illustrative embodiments of FIG. 8*a* differ from the illustrative embodiments as described above in that the barrier element 83 has a negative spacing with regard to the contact pad 82 or, in other words, the barrier element 83 is formed on the contact pad 82. Additionally, it is possible that the barrier element 83 is provided as a partially surrounding barrier element corresponding to the barrier element 75' of FIG. 7. It may be considered that the illustrative embodiments as shown with regard to FIG. 8*a* represent a case in which a spacing between the barrier element 83 and the contact pad 82 is negative.

Figure 8B:
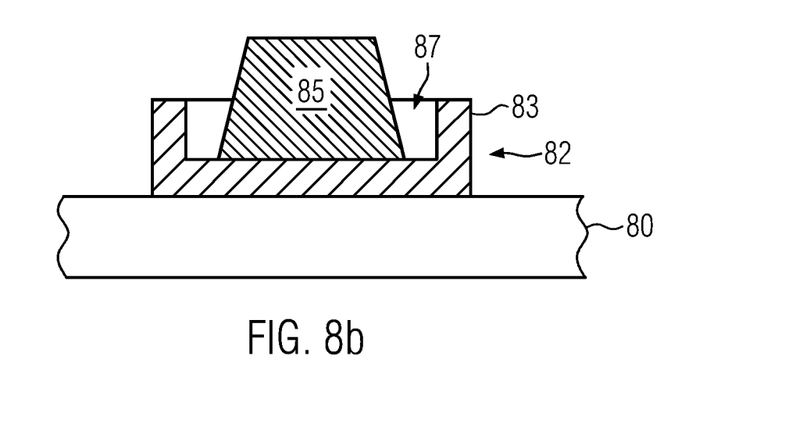
FIG. 8b schematically shows, in a cross-sectional view along line B-B in FIG. 8a, the contact portion in accordance with some illustrative examples herein.

With regard to FIG. 8*b*, some illustrative embodiments of the embodiments of FIG. 8*a* will be described. FIG. 8*b* schematically shows a cross-sectional view of FIG. 8*a* along line B-B in FIG. 8*a*. In these illustrative embodiments, the barrier element 83 of FIG. 8*a* may be formed by providing the contact pad 82 having a recess 87 in a center portion of the contact pad 82, the recess being formed by microetching, for example. Accordingly, the contact pad 82 comprises the recess 87 as the center portion of the contact pad 82 having an upper surface located higher than an upper surface of a rim or wall portion of the contact pad 82 encircling the recess 87 and forming the barrier element 83. In other words, the barrier element 83 provides a wall that is acting as barrier element 83 with regard to the solder material 85, e.g., representing a solder bump, placed in the recess 87.

Figure 9A:
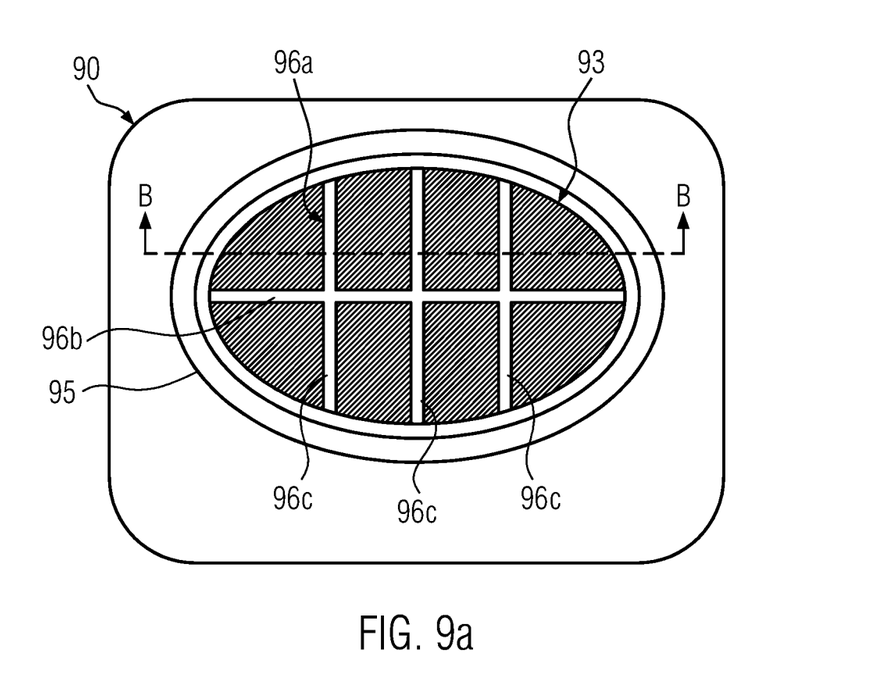
FIG. 9a schematically shows, in a top view, a contact portion of a module in accordance with another illustrative embodiment of the present disclosure.
Figure 9B:
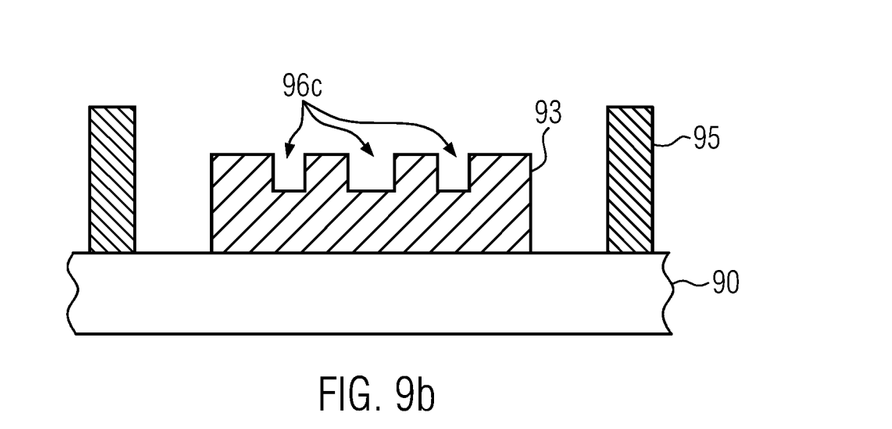

Referring to FIG. 9*a*, another illustrative embodiment of the present disclosure is schematically illustrated in a top view, while FIG. 9*b* shows a schematic cross sectional view along line B-B in FIG. 9*b*.

Referring to FIGS. 9*a* and 9*b*, a contact portion 90 of a support, e.g., a PCB substrate or a tape or any other appropriate carrier element, is shown. The contact portion 90 has a contact pad 93 and a barrier element 95 which at least partially surrounds the contact pad 93. In some illustrative example herein, the barrier element 95 may be formed by depositing a solder resist on an upper surface of the contact portion 90. Alternatively or additionally, the barrier element may be provided by patterning the upper surface of the contact portion 90 so as to realize the barrier element 95 in the upper surface of the contact portion 90. Referring to FIG. 9*b*, a thickness of the contact pad 93 may be smaller than a height of barrier element 95.

In accordance with some illustrative examples herein, a barrier pattern 96*a* comprising at least one barrier line may be formed on the contact pad 93. For example, and as illustrated without limitation in FIG. 9*a*, the barrier pattern 96*a* may be formed by a barrier array comprising barrier lines 96*b*, 96*c* which may be arranged in an orthogonal array comprising at least one barrier line extending along a first direction, e.g., the barrier line 96*b*, and at least one barrier line extending along a second direction which is substantially perpendicular to the first direction, e.g., the barrier line(s) 96*c*. For example and as illustrated in FIG. 9*a*, the barrier pattern 96*a* comprises a plurality of barrier lines being formed by the barrier line 96*c* and at least one additional parallel barrier line 96*c* is arranged so as to be orthogonal to the barrier line 96*b*.

As shown in FIG. 9*b* and in accordance with some illustrative examples, the barrier pattern 96*a* may be formed by one or more micro-etchings that are provided in an upper surface of the contact pad 93. For example, the barrier pattern 96*a* may comprise one or more trenches formed by micro-etching subjected to the contact pad 93 or, alternatively, the barrier array 96*a* may be formed by a laser process. However, this does not pose any limitation to the present disclosure and, alternatively, the upper surface of the contact pad 93 may be exposed to some micro-etching such that one or more elevation (not illustrated), e.g., one or more rip-shaped elevation (not illustrated) may be formed in the upper surface of the contact pad 93. Additionally or alternatively, the barrier pattern 96*a* may comprise one or more trenches and one or more elevations. Accordingly, at least one barrier line of the barrier pattern 96*a* may be either a trench or an elevation formed in the upper surface of the contact pad 93 and, optionally, at least one other barrier line of the barrier pattern 96*a* may be the other one of the trench and the elevation.

In effect, the barrier lines 96*c* and 96*b* partition the upper surface of the contact pad 93 into a plurality of separated sections or, in other words, the upper surface of the contact pad 93 is patterned by the barrier pattern 96*a*, such that a flow of solder material (not illustrated) is hindered in spreading over the upper surface of the contact pad 93 once the solder material (not illustrated) is molten in a reflow process, e.g., the reflow process employed during module integration. So to speak, the barrier pattern 96*a* allows to prevent or at least slow down any movement of solder material (not illustrated) placed on the upper surface of the contact pad 93.

Although FIGS. 9*a* and 9*b* show the barrier pattern 96*a* as an orthogonal array of lines 96*b*, 96*c*, the person skilled in the art will appreciate that this is only illustrative and not limiting. Instead of the explicitly shown orthogonal array of lines 96*b*, 96*c*, the barrier pattern 96*a* may be implemented in any other pattern, e.g., by curved patterns, such as oval patterns, ring patterns, ring portion patterns, polygonal patterns, such as squared patterns, rectangular patterns, a combination of curved patterns and polygonal patterns, etc. Herein, line sections/portions and/or curved sections/portions surrounding a center of the contact pad, produce a general barrier pattern.

Although none of the embodiments illustrated in FIGS. 6*a*, 6*b*, 7, 8*a*, 8*b* and 9*a* and 9*b* explicitly show a flux, the person skilled in the art will appreciate that a flux is formed on a surface of the solder materials so as to at least partially cover the solder materials with flux material, e.g., sidewall surfaces of solder materials.

Although FIGS. 7 to 9 do not explicitly show an adhesive layer, the person skilled in the art will appreciate that an adhesive layer corresponding to the adhesive layer 77 in FIGS. 6*a* and 6*b* may be present.

Although FIGS. 9*a* and 9*b* show a positive spacing between the barrier element 95 and the contact pad 93, this does not pose any limitation on the present disclosure and the barrier element 95 may have a negative spacing with regard to the contact pad 93 in analogy to the disclosure regarding FIGS. 8*a* and 8*b* above. Herein, the barrier element 95 in FIGS. 9*a* and 9*b* would be replaced by a barrier element formed in accordance with the barrier element 83 in FIGS. 8*a* and 8*b*.

In summary and as it will be clear to the skilled person after a complete lecture of the embodiments described above, the present disclosure relates, in various illustrative embodiments, to a module and, in at least some illustrative embodiments, to a wire pad design for establishing a solder connect from at least one smart card module to at least one wire pad provided in a recess or cavity of a card body. Herein, a solder bump may be provided with the module without applying external flux material during a solder process and/or a reflow process of the solder bump. In some illustrative embodiments of the present disclosure, the solder material and flux material is applied to a module first before implanting the module into a card body.

As an advantage, some illustrative embodiments of the present disclosure allow an improvement of known interconnection concepts by applying a solder and a optionally together with a flux material prior to implanting a module into a card body to the module without additionally applying a solder material to contacts in the card body before inserting the module into the card body.

In some illustrative embodiments of the present disclosure, a module with a reflow solder bump on connection pads of the module is provided, the solder bump having flux residuals on its surface containing active flux elements which are to be activated during subsequent module implanting processes in the fabrication flow of a smart card. In these illustrative embodiments, a contact pad may be provided as a pure contact pad or a surrounding barrier element, which at least partially surrounds the contact pad as a solder stop and barrier layer may be provided. Additionally or alternatively, an adhesive layer may be provided around the contact pad, such as a hot melt or the like.

In accordance with some illustrative embodiments as described above, an illustrative module implanting process for making interconnection of a solder material contained on a module with a wire pad, possibly milled when forming a recess in a card body by milling the recess into the card body, using flux residuals is shown, the flux residuals resulting from a possible first reflow process subjected to solder materials so as to form solder bumps on the module. The solder connection is established by using the flux residuals and reactivating the remaining active elements of residuals on the solder material of the module. Such a solder step comprises a step of applying heat and pressure to the module inserted into the card body, followed by cooling step.

In accordance with some illustrative embodiments of the present disclosure, a support of an illustrative module as described above by means of the support 3 and 3' may be made of e.g. tape (such as epoxy-glass tape), PI, PEN, PET and the like.

In accordance with some illustrative embodiments as described above, a barrier element may be provided for at least partially controlling a spreading of solder material during the implantation of a module into a card body of a smart card. Herein, the spreading may be particularly controlled by appropriately setting a height and shape of the barrier element as described above with regard to FIGS. 6*a*, 6*b*, 7, 8*a*, 8*b*, 9*a* and 9*b*.

As an advantage of not using solder material in addition to the solder material of the module, less energy is needed for melting the solder and shorter implanting time may be achieved. Furthermore, due to a reduced amount of solder material employed during the implanting of modules into a card body as described above in the various illustrative embodiments, the solder is better controllable during the implantation. Furthermore, it is found by the inventors that less active flux remains in interconnections of accordingly implanted modules as described above.

An advantage of barrier elements is that a preforming of a solder bump shape may be achieved, e.g. a longitudinal solder bump may be formed using an oval contact pad, optionally together with an appropriate barrier element, for providing a solder bump that perfectly corresponds to a high density wire pad of a card body. A controlling of the position of solder on the module can be further supported by an adhesive layer surrounding the contact pad on which a solder material is provided in the module.

At least one of the following advantages may be achieved when practicing the subject matter of the present disclosure in accordance with at least one of the various described embodiments:

A strong solder connect between a module and a card body of a smart card may be achieved.

No additional solder material or flux is to be provided during the implantation of a module into a card body of a smart card.

Solder and flux, that is remaining active flux in flux residuals from a first reflow of solder, may be pre-applied on the module, particularly on a solder bump of a module.

A comparatively large solder connect is possible due to a freedom in the choice of shape of solder bump, such as an oval shape of solder bump, thereby increasing the reliability of a solder interconnect.

The various illustrative embodiments described above provide a relatively easy processing during the implanting compared to known solder connect techniques.

The various illustrative embodiments as described above allow to use a wire pad which provides a large wire pad area accessible for performing solder connects.

According to the various illustrative embodiments as described above, less remaining active flux residuals may remain present in the final interconnect, thereby leading to less corrosion in fabricated smart card.

Employing barrier elements in module according to at least some of the above described illustrative embodiments, allow to prevent wide solder spreading during implantation when forming a smart card.

With regard to any of the above described embodiments, it is to be understood that a solder material may be deposited on a contact pad by depositing a plurality of solder portions on the contact pad, e.g., several hundreds of ball-shaped solder portions, which are in reflown in a reflow process to form a single solder bump. This solder bump may be exposed to a second reflow process during module integration, wherein solder bump(s) of a module are brought into mechanical contact with substrate contact(s) of a substrate into which the module it to be integrated or to which the module is to be connected. Upon applying heat and pressure during a certain time period, e.g., up to 3 s, the solder bump(s) is/are reflown so as to provide mechanical and electrical connection of the module to the substrate contact(s).

These and other advantages will become apparent to the person skilled in the art who has the benefits of the present disclosure.

The invention claimed is:

1. A module for integrating into a card body of a smart card, the module comprising:
   a support;
   a contact portion formed on a first surface of the support; and
   a solder material formed on the contact portion,
   wherein a surface of the solder material is at least partially covered by a flux,
   wherein the flux is formed of flux residuals provided on a surface portion of the solder material.

2. The module of claim 1, wherein the solder material is a low-temperature solder material, preferably one of SnBi, SnBiAg and InBi and/or the solder material is provided as a solder bump.

3. The module of claim 1, wherein the flux is a flux from RMA type.

4. The module of claim 1, wherein module is one of a contact module, a chip module, a biometric sensor module, a display module, and an ISO connection module, wherein the contact module comprises a plurality of contact pads on a second surface opposite the first surface, at least one of the plurality of contact pads being in electrical connection with the contact portion on the first surface.

5. The module of claim 1, further comprising a barrier element formed in the contact portion and at least partially surrounding the solder material.

6. The module of claim 5, wherein the barrier element has a thickness in a range from about 5 µm to about 100 µm, preferably in a range from about 5 µm to 70 µm or 10 µm to 100 µm, more preferably in a range from about 10 µm to about 70 µm.

7. A module for integrating into a card body of a smart card, the module comprising:
a support;
a contact portion formed on a first surface of the support;
a solder material formed on the contact portion,
wherein a surface of the solder material is at least partially covered by a flux; and
a barrier element formed in the contact portion and at least partially surrounding the solder material,
wherein the contact portion comprises a contact pad, the barrier element being formed by a wall section of the contact pad at least partially encircling a recess formed in a center portion of the contact pad.

8. The module of claim 5, wherein the barrier element is arranged in a distance of the planar contact pad element or the barrier element partially covers the planar contact pad element.

9. The module of claim 1, wherein the contact portion comprises a planar contact pad element on which the solder material is formed.

10. The module of claim 9, wherein the planar contact pad element has, in a top view, a substantially oval shape or a substantially line shape.

11. The module of claim 9, wherein the planar contact pad is in electrical connection with a conductor line formed in the first surface.

12. The module of claim 1, further comprising an adhesive layer, preferably a hot melt layer, formed over the support on the first surface, wherein the contact portion is exposed by a cavity formed in the adhesive layer.

13. The module of claim 1, wherein the contact pad has a barrier pattern formed in an upper surface of the contact pad.

14. A smart card, comprising:
a card body of the smart card having at least one recess formed therein; and
at least one module comprising:
a support;
a contact portion formed on a first surface of the support; and
a solder material formed on the contact portion,
wherein a surface of the solder material is at least partially covered by a flux, wherein the flux is formed of flux residuals provided on a surface portion of the solder material, and
wherein each of the at least one module is accommodated into a respective one of the at least one recess.

15. The smart card of claim 14, wherein each of the at least one recess has a body contact portion which is in electrical contact with the contact portion of the module accommodated therein.

16. The smart card of claim 15, wherein the body contact portion is provided by a wire pad formed of a plurality of wires exposed in the body contact portion towards the contact portion.

17. A smart card, comprising:
a card body of the smart card having at least one recess formed therein; and
at least one module comprising:
a support;
a contact portion formed on a first surface of the support; and
a solder material formed on the contact portion,
wherein a surface of the solder material is at least partially covered by a flux,
wherein each of the at least one module is accommodated into a respective one of the at least one recess,
wherein each of the at least one recess has a body contact portion which is in electrical contact with the contact portion of the module accommodated therein,
wherein the body contact portion is provided by a wire pad formed of a plurality of wires exposed in the body contact portion towards the contact portion,
wherein the plurality of wires have a wire pitch of at least 300 µm, preferably of at least 200 µm, more preferably of at least 100 µm, wherein wires of the plurality of wires have a diameter in a range from about 50 µm to about 300 µm, preferably in a range from about 50 µm to about 200 µm or from about 80 µm to about 300 µm, more preferably from about 80 µm to about 200 µm, and/or wherein the plurality of wires is made of copper, a copper alloy or a copper tin alloy, preferably at least some of the plurality of wires being at least partially covered by an insulating coating.

18. A method of implanting a module into a card body of a smart card, the method comprising:
providing at least one module comprising:
a support;
a contact portion formed on a first surface of the support; and
a solder material formed on the contact portion,
wherein a surface of the solder material is at least partially covered by a flux, wherein the flux is formed of flux residuals provided on a surface portion of the solder material;
providing the card body of the smart card;
forming at least one recess in a surface of the smart card;
inserting each of the at least one module into a respective one of the at least one recess,
wherein each of the at least one recess has a body contact portion formed in a bottom surface of the recess, the body contact portion being brought into contact with the solder material of the module inserted into the recess, wherein the solder material is at least partially covered with the flux; and
performing a thermal treatment to at least partially reflow the solder material of the at least one module after each of the at least one module is inserted into a respective one of the at least one recess.

19. The method of claim 18, wherein the at least one module comprises an adhesive layer, the method further comprising a thermal treatment for activating the adhesive layer.

* * * * *